US009064755B2

(12) United States Patent
Park et al.

(10) Patent No.: US 9,064,755 B2
(45) Date of Patent: Jun. 23, 2015

(54) ORGANIC LIGHT-EMITTING DISPLAY DEVICE AND METHOD OF MANUFACTURING THE SAME

(75) Inventors: Sun Park, Yongin (KR); Yul-Kyu Lee, Yongin (KR); Chun-Gi You, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 280 days.

(21) Appl. No.: 13/473,079

(22) Filed: May 16, 2012

(65) Prior Publication Data

US 2013/0119392 A1    May 16, 2013

(30) Foreign Application Priority Data

Nov. 14, 2011   (KR) .................. 10-2011-0118534

(51) Int. Cl.
   *H01L 29/04*   (2006.01)
   *H01L 27/12*   (2006.01)
   *H01L 27/32*   (2006.01)

(52) U.S. Cl.
   CPC .......... *H01L 27/1259* (2013.01); *H01L 27/326* (2013.01); *H01L 27/3265* (2013.01); *H01L 27/3276* (2013.01); *H01L 2227/323* (2013.01)

(58) Field of Classification Search
   CPC .............. H01L 27/326; H01L 27/1259; H01L 27/3265; H01L 2227/323; H01L 27/3276; H01L 29/786
   USPC ................ 257/72, E29.273, E21.411; 438/34
   See application file for complete search history.

(56) References Cited

U.S. PATENT DOCUMENTS

| 5,953,094 | A | 9/1999 | Matsuoka |
| 2002/0051110 | A1* | 5/2002 | Kim .............................. 349/149 |
| 2002/0074549 | A1* | 6/2002 | Park et al. ...................... 257/59 |
| 2005/0110023 | A1 | 5/2005 | Lee et al. |
| 2006/0054889 | A1* | 3/2006 | Kim et al. ...................... 257/59 |
| 2007/0002249 | A1 | 1/2007 | Yoo et al. |
| 2008/0032431 | A1 | 2/2008 | Hsu et al. |
| 2011/0108848 | A1* | 5/2011 | Lee et al. ......................... 257/72 |
| 2011/0291119 | A1 | 12/2011 | Ryu et al. |

FOREIGN PATENT DOCUMENTS

| JP | 1998-282515 | 10/1998 |
| KR | 10-2003-0096675 | 12/2003 |
| KR | 10-2007-0002415 | 1/2007 |
| KR | 10-2008-0080740 | 9/2008 |

* cited by examiner

*Primary Examiner* — Asok K Sarkar
*Assistant Examiner* — Dmitriy Yemelyanov
(74) *Attorney, Agent, or Firm* — Robert E. Bushnell, Esq.

(57) ABSTRACT

An organic light-emitting display device having a thin film transistor including an active layer, a gate electrode, a lower gate electrode, an upper gate electrode, an insulating layer covering the gate electrode, source and drain electrodes that are formed on the insulating layer and contact the active layer. An organic light-emitting diode is electrically connected to the thin film transistor and includes a pixel electrode formed at the same layer level as the lower gate electrode, an intermediate layer including an emission layer, and a counter electrode. A lower pad electrode is formed at the same layer level as the lower gate electrode and an upper pad electrode is formed at the same layer level as the upper gate electrode.

11 Claims, 7 Drawing Sheets

ORGANIC LIGHT-EMITTING DISPLAY DEVICE AND METHOD OF MANUFACTURING THE SAME

CLAIM PRIORITY

This application makes reference to, incorporates the same herein, and claims all benefits accruing under 35 U.S.C. §119 from an application earlier filed in the Korean Intellectual Property Office on 14 Nov. 2011 and there duly assigned Serial No. 10-2011-0118534.

BACKGROUND OF THE INVENTION

1. Field of the Invention

One or more aspects of the present invention relates to an organic light-emitting display device and a method of manufacturing the same.

2. Description of the Related Art

Recently, display devices have been replaced by portable thin flat panel display devices. Among thin flat panel display devices, organic light-emitting display devices, which are self-emissive display devices, are expected to be display devices of the next generation due to their advantages: wide viewing angles, high contrast, and short response times.

An organic light-emitting display device includes an intermediate layer, a first electrode, and a second electrode. The intermediate layer includes an organic emission layer. When a voltage is applied between the first electrode and the second electrode, the organic emission layer emits visible rays.

In addition, the organic light-emitting display device includes a driving circuit unit that generates an electrical signal and a pad unit that transmits the electrical signal generated by the driving circuit unit.

In this regard, a welding process between the driving circuit unit and the pad unit is not easy to perform and thus adhesion characteristics therebetween and adhesion characteristics between the driving circuit unit and a substrate of an organic light-emitting display device are deteriorated. Therefore, there are limitations on improving the durability of the organic light-emitting display device.

The above information disclosed in this Related Art section is only for enhancement of understanding of the background of the invention and therefore it may contain information that does not form the prior art that is already known to a person of ordinary skill in the art.

SUMMARY OF THE INVENTION

One or more aspects of the present invention provide for an organic light-emitting display device with improved corrosion resistance.

One or more aspects of the present invention also provide for a method of manufacturing the organic light-emitting display device.

According to an aspect of the present invention, there is provided an organic light-emitting display device including: a thin film transistor including an active layer, a gate electrode that is insulated from the active layer and includes a lower gate electrode and an upper gate electrode, an insulating layer covering the gate electrode, source and drain electrodes that are formed on the insulating layer and contact the active layer; an organic light-emitting diode that is electrically connected to the thin film transistor and includes a pixel electrode formed at the same layer level as the lower gate electrode, an intermediate layer including an emission layer, and a counter electrode, wherein the pixel electrode, the intermediate layer, and the counter electrode are sequentially stacked; and a pad electrode including a lower pad electrode formed at the same layer level as the lower gate electrode and an upper pad electrode formed at the same layer level as the upper gate electrode, wherein the insulating layer covers a top surface of the upper pad electrode, wherein the upper pad electrode includes an opening formed in the insulating layer and the upper pad electrode to expose a portion of the lower pad electrode.

The upper pad electrode may have an undercut shape in which the insulating layer entirely covers the upper pad electrode and overhangs the upper pad electrode.

The undercut shape may be formed such that the upper pad electrode is inner than the insulating layer. The upper pad electrode has a surface entirely encompassed by the insulating layer with a portion of the insulating layer extending beyond the surface of the upper pad electrode.

A top surface of the lower pad electrode may be exposed to the outside through the opening and a side surface of the upper pad electrode may be electrically connected to a driver IC that supplies a current to operate the organic light-emitting display device.

The top surface of the lower pad electrode may be exposed to the outside through the opening and the side surface of the upper pad electrode may be electrically connected to the driver IC through conductive balls.

The pad electrode may be electrically connected with the thin film transistor or the organic light-emitting diode through a wire.

The lower pad electrode may include a higher corrosion resistant material than that of the upper pad electrode.

The lower gate electrode, the pixel electrode, and the lower pad electrode may include a transparent conductive metal oxide, and the upper gate electrode and the upper pad electrode may include at least one selected from silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and copper (Cu).

The organic light-emitting display device may further include a capacitor that includes a lower capacitor electrode formed at the same layer level as the active layer and an upper capacitor electrode formed at the same layer level as the gate electrode, and is electrically connected with the thin film transistor.

According to another aspect of the present invention, there is provided a method of manufacturing an organic light-emitting display device, the method including: a first mask process for forming an active layer of a thin film transistor on a substrate; a second mask process for forming, on the active layer, a first electrode unit for forming a pixel electrode, a gate electrode, and a second electrode unit for forming a pad electrode; a third mask process for forming contact holes that expose both sides of the active layer, an opening that exposes a portion of the first electrode unit, an opening that exposes a portion of the second electrode unit, and an interlayer insulating layer on the second electrode unit to expose a portion of the second electrode unit; a fourth mask process for forming source and drain electrodes that contact the active layer through the contact holes, the pixel electrode from the first electrode unit, and the pad electrode having an undercut shape from the second electrode unit in which the insulating layer entirely covers the upper pad electrode and overhangs the upper pad electrode; and a fifth mask process for forming a pixel-defining layer that exposes at least a portion of the pixel electrode.

The second mask process may include sequentially forming a first insulating layer, a first conductive layer, and a second conductive layer on the substrate to cover the active layer; and simultaneously patterning the first conductive layer and the second conductive layer to form the gate electrode such that a part of the first conductive layer is a lower gate electrode and a part of the second conductive layer is an upper gate electrode and to form the second electrode unit such that a part of the first conductive layer is a lower pad electrode and a part of the second conductive layer is an upper pad electrode.

The fourth mask process may include: forming a third conductive layer on the interlayer insulating layer; patterning the third conductive layer to form the source and drain electrodes; and removing a portion of the second conductive layer constituting the first electrode unit to form a pixel electrode comprising a part of the first conductive layer and partially removing a part of the upper pad electrode constituting the second electrode unit to form the pad electrode by forming an opening that exposes a portion of the lower pad electrode. A removed area of the upper pad electrode is greater than a removed area of the interlayer insulating layer so that the upper pad electrode has an undercut shape in which the insulating layer entirely covers the upper pad electrode and overhangs the upper pad electrode.

The third mask process may include forming a second insulating layer on the first electrode unit, the gate electrode, and the pad electrode; and patterning the second insulating layer to form an opening that exposes a portion of the first electrode unit and an opening that exposes a portion of the second electrode unit.

The fifth mask process may include: forming a fourth insulating layer on an entire surface of the substrate to cover the source and drain electrodes; and patterning the fourth insulating layer to form the pixel-defining layer and removing the remaining fourth insulating layer on the interlayer insulating layer that is formed on the pad electrode.

The first mask process may further include forming a lower capacitor electrode on a substrate at the same layer level as the active layer and the second mask process may further include forming an upper capacitor electrode on a top surface of the lower capacitor electrode.

After the fifth mask process, the method may further include forming on the pixel electrode an intermediate layer comprising an emission layer and a counter electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Exemplary embodiments of the present invention will now be described in detail in terms of structures and functions with reference to the accompanying drawings. As those skilled in the art would realize, the described embodiments may be modified in various different ways, all without departing from the spirit or scope of the principles for the present invention.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present.

In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

Figure 1:
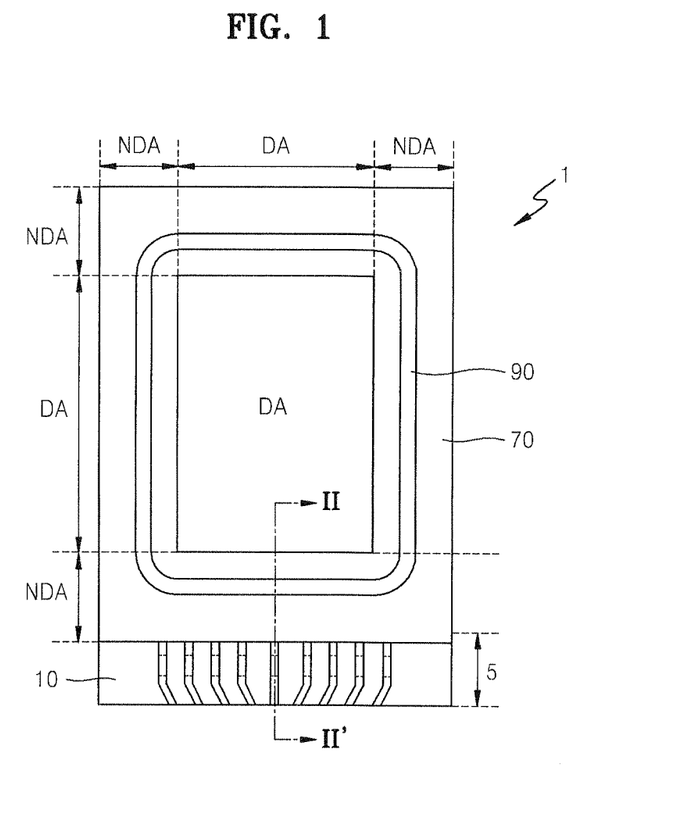
FIG. 1 is a schematic plan view illustrating a structure of an organic light-emitting display device according to an embodiment of the present invention.

FIG. 1 is a schematic plan view illustrating a structure of an organic light-emitting display device 1 according to an embodiment of the present invention.

Referring to FIG. 1, the organic light-emitting display device 1 may include a first substrate 10 that includes a plurality of light-emitting pixels and a second substrate 70 that is attached to the first substrate 10 by sealing.

A thin film transistor (TFT), an organic light-emitting diode (OLED), and a capacitor may be formed on the first substrate 10. The first substrate 10 may be a low-temperature polycrystalline silicon (LTPS) substrate, a glass substrate, or a plastic substrate.

The second substrate 70 may be an encapsulation substrate disposed on the first substrate 10 to prevent external moisture and air from permeating into TFTs and the light-emitting pixels formed on the first substrate 10. The second substrate 70 faces the first substrate 10, and the first and second substrates 10 and 70 are attached to each other by a sealing member 90 formed on edges thereof. The second substrate 70 may be a glass substrate, a plastic substrate, or a stainless using steel (SUS) substrate.

The first substrate 10 may include a light-emitting region DA and a non-light-emitting region NDA that is outside the light-emitting region DA. In embodiments, the sealing member 90 is positioned on the non-light-emitting region NDA on the outside of the light-emitting region DA to attach the first and second substrates 10 and 70.

As described above, the organic light-emitting diode, the TFT that drives the organic light-emitting diode, and a wire that is electrically connected thereto are formed on the light-emitting region DA of the first substrate 10. The non-light-emitting region NDA may include a pad region 5 in which a pad electrode PAD formed extending from the wire of the light-emitting region DA is positioned.

Figure 2:
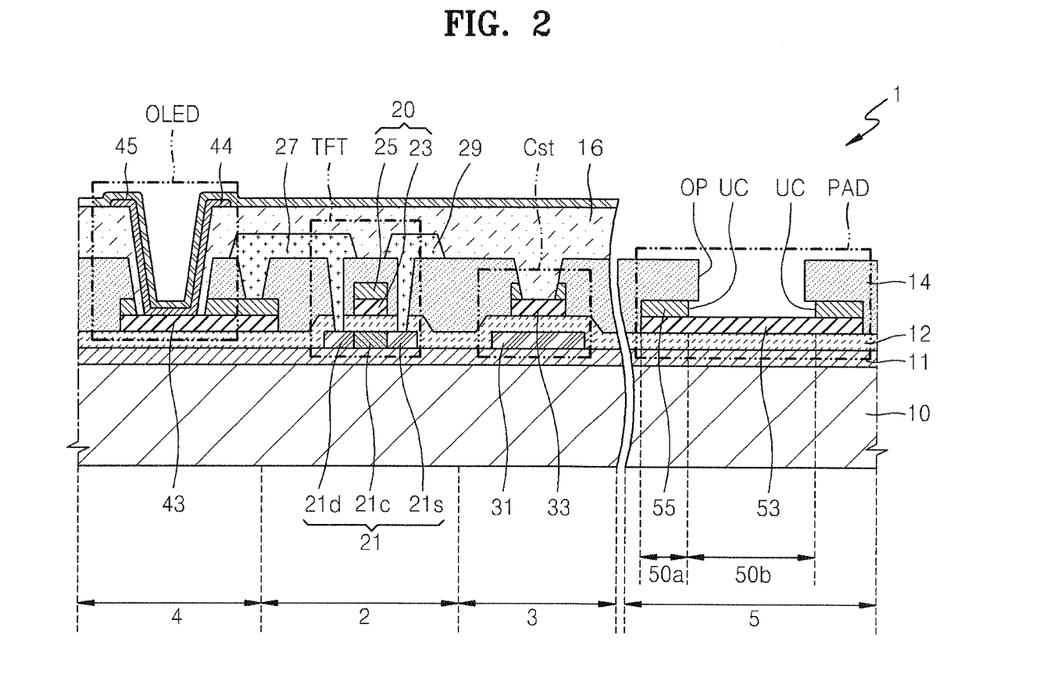
FIG. 2 is a cross-sectional view taken along line II-II' of FIG. 1, according to an embodiment of the present invention.

FIG. 2 is a cross-sectional view taken along line II-II' of FIG. 1, according to an embodiment of the present invention.

Referring to FIG. 2, the organic light-emitting display device 1 includes a transistor region 2, a storage region 3, a light-emitting region 4, and a pad region 5.

The transistor region 2 may include a TFT as a driving device. The TFT may include an active layer 21, a gate electrode 20, and source/drain electrodes 29 and 27. The gate electrode 20 may include a lower gate electrode 23 and an upper gate electrode 25 formed on the lower gate electrode 23. In this regard, the lower gate electrode 23 may be formed of a transparent conductive material and may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The upper gate electrode 25 may be in the form of a single layer of a metal such as Mo, MoW, or an Al-based alloy or an alloy thereof or multi-layers of at least two layers, but is not limited thereto. A first insulating layer 12, which is a gate insulating layer, may be interposed between the gate electrode 20 and the active layer 21 to insulate the gate electrode 20 from the active layer 21. In addition, the active layer 21 includes source/drain regions 21s and 21d on both sides thereof that are doped with a high concentration of an impurity and that are connected to the source/drain electrodes 29 and 27, respectively.

The storage region 3 may include a capacitor Cst. The capacitor Cst includes a lower capacitor electrode 31, an upper capacitor electrode 33, and the first insulating layer 12 interposed therebetween. In this regard, the lower capacitor electrode 31 and the active layer 21 of the TFT are formed at the same layer level. The lower capacitor electrode 31 may be formed of a semiconductor material and is doped with an impurity, thereby having improved electrical conductivity. The upper capacitor electrode 33, the lower gate electrode 23 of the TFT, and a pixel electrode 43 of the OLED may be formed at the same layer level.

The light-emitting region 4 may include the OLED. The OLED may include the pixel electrode 43 that is connected to one of the source and drain electrodes 29 and 27 of the TFT, a counter electrode 45 facing the pixel electrode 43, and an intermediate layer 44. The pixel electrode 43 may be formed of a transparent conductive material, and the pixel electrode 43 and the lower gate electrode 23 of the TFT may be formed of the same material at the same layer level.

The pad region 5 may include the pad electrode PAD. Although not illustrated in FIG. 2, the pad electrode PAD may be electrically connected to the TFT or the OLED through wires (not shown). In addition, the pad electrode PAD may be electrically connected to a driver IC (not shown) for supplying a current to operate the organic light-emitting display device 1. Thus, the pad electrode PAD supplies a current supplied by the driver IC (not shown) to the TFT or the OLED in the light-emitting region (DA of FIG. 1). The pad electrode PAD may include a lower pad electrode 53 that is formed of the same material at the same layer level as the lower gate electrode 23 and an upper pad electrode 55 that is formed of the same material at the same layer level as the upper gate electrode 25. That is, the lower pad electrode 53 may be formed of a conductive metal oxide such as indium tin oxide (ITO), indium zinc oxide (IZO), zinc oxide (ZnO), indium oxide ($In_2O_3$), indium gallium oxide (IGO), or aluminium zinc oxide (AZO), and the upper pad electrode 55 may be formed of a single layer of a metal such as Mo, MoW, or an Al-based alloy or an alloy thereof or multi-layers of at least two layers.

The pad electrode PAD may include a first connection part 50a that is connected to the light-emitting region (DA of FIG. 1) through a wire (not shown) and a second connection part 50b that is connected to a driver IC (not shown). The second connection part 50b is may be exposed to the outside through an opening OP to be electrically connected to an external driver IC (not shown).

The lower pad electrode 53 is exposed to the outside through the opening OP, and the exposed lower pad electrode 53 is formed of a metal oxide such as ITO as described above, thereby having improved corrosion resistance.

The first connection part 50a may be electrically connected to an internal device through a wire (not shown) and is covered by a second insulating layer 14, which is an interlayer insulating layer, to insulate the first connection part 50a and other elements. In other words, a top surface of the upper pad electrode 55 is covered by the second insulating layer 14 and thus the top surface of the upper pad electrode 55 is not exposed to the outside and the upper pad electrode 55 has an undercut UC shape as compared to the second insulating layer 14. This uncut shape enables a portion to second insulating layer 14 to entirely cover the upper pad electrode 55 and overhang the upper pad electrode 55. In other words, the second insulating layer 14 overhangs the upper pad electrode 55. A top surface of the lower pad electrode 53 that is exposed through the opening OP and a side surface of the upper pad electrode 55 are electrically connected to an external driver IC (not shown) through conductive balls 80 (refer to FIG. 12). This will be described below in more detail with reference to FIG. 12.

Hereinafter, structural effects of the organic light-emitting display device 1 will be described. For example, when the second connection part 50b may include only the lower pad electrode 53, wherein the lower pad electrode 53 is electrically connected to a driver IC (not shown) with the upper pad electrode 55 not electrically connected thereto, the display quality of more than 40-inch large-screen panels is deteriorated due to resist distribution. Experimentally, a pad consisting of only the lower pad electrode 53 has an average resistance of about 621Ω (ohm) and a standard deviation of about 599Ω. When the second connection part 50b is configured such that only the upper pad electrode 55 is exposed, wherein the upper pad electrode 55 is electrically connected to a driver IC (not shown), that is, when the pad electrode PAD includes only the upper pad electrode 55 without including the lower pad electrode 53, a pad consisting of only the upper pad electrode 55 has an average resistance of about 144Ω and a standard deviation of about 2Ω. In other words, the resist distribution is improved, but a metal material constituting the upper pad electrode 55 is directly exposed to the outside and thus the metal easily corrodes. Thus, due to such a reduction in corrosion resistance, reliability of the organic light-emitting display device 1 is reduced. To address these problems, according to the structure of the organic light-emitting display device 1 illustrated in FIG. 2, the upper pad electrode 55 is formed on the lower pad electrode 53 and thus the resist distribution and contact resistance may be improved. In addition, the lower pad electrode 53, formed of a metal oxide, such as ITO, is exposed through the opening OP and thus the organic light-emitting display device 1 may have improved corrosion resistance.

FIGS. 3 through 11 are schematic cross-sectional views sequentially illustrating a method of manufacturing the organic light-emitting display device 1 of FIG. 2, according to embodiments of the present invention. Hereinafter, the manufacturing processes of the organic light-emitting display device 1 of FIG. 2 will be described in more detail.

Figure 3:
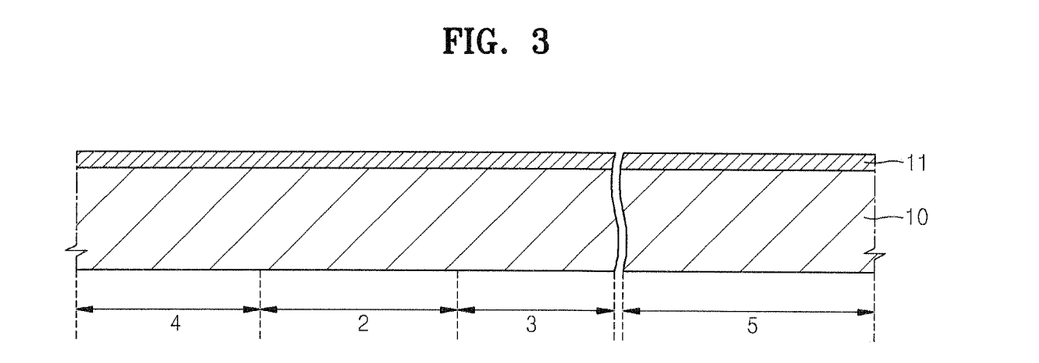
FIGS. 3 through 11 are schematic cross-sectional views sequentially illustrating a method of manufacturing the organic light-emitting display device of FIG. 2, according to embodiments of the present invention.

Referring to FIG. 3, first, an auxiliary layer 11 is formed on a first substrate 10. The first substrate 10 may be transparent glass consisting mainly of $SiO_2$. However, the first substrate 10 is not limited to the above example and may be formed of transparent plastic or metal.

The auxiliary layer 11 such as a barrier layer, a blocking layer, and/or a buffer layer may be formed on the first substrate 10 in order to prevent impurity ions from diffusing into the first substrate 10, prevent external moisture or air from permeating thereinto, and planarize a surface of the first substrate 10. The auxiliary layer 11 may be formed by depositing $SiO_2$ and/or $SiN_x$ by plasma-enhanced chemical vapor deposition (PECVD), atmospheric pressure CVD (APCVD), low pressure CVD (LPCVD), or the like.

Figure 4:
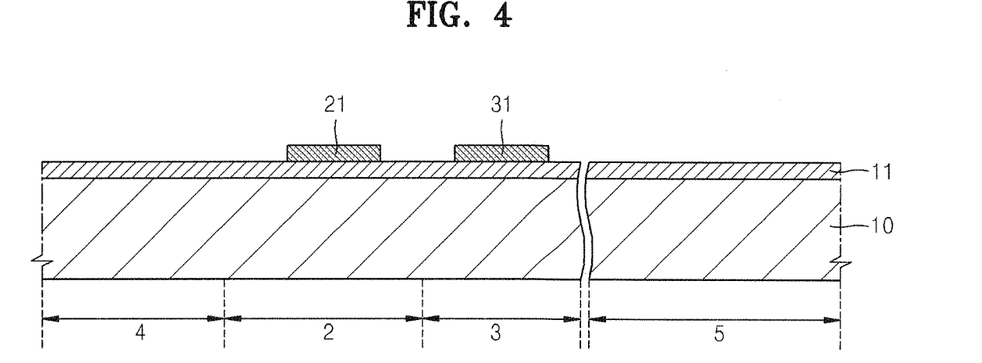

Next, referring to FIG. 4, the active layer 21 of the TFT and the lower capacitor electrode 31 are formed on the auxiliary layer 11. In detail, an amorphous silicon layer (not shown) is first deposited on the auxiliary layer 11 and crystallized to form a polycrystalline silicon layer (not shown). The amorphous silicon layer may be crystallized using various methods such as rapid thermal annealing (RTA), solid phase crystallization (SPC), excimer laser annealing (ELA), metal-induced crystallization (MIC), metal-induced lateral crystallization (MILC), sequential lateral solidification (SLS), or the like. The polycrystalline silicon layer is patterned into the active layer 21 of the TFT and the lower capacitor electrode 31 by performing a mask process using a first mask (not shown).

In this embodiment, the active layer 21 is formed separately from the lower capacitor electrode 31, but the active layer 21 and the lower capacitor electrode 31 may be integrally formed.

Figure 5:
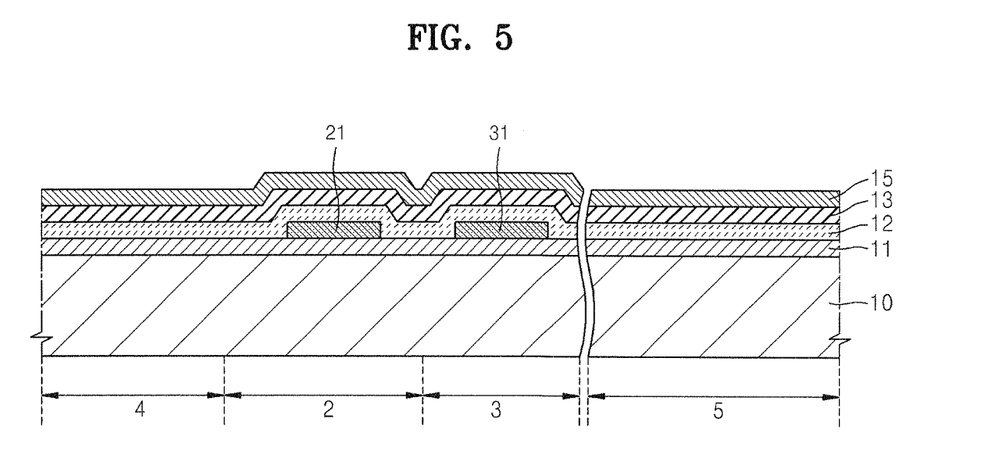

Next, referring to FIG. 5, the first insulating layer 12, a first conductive layer 13, and a second conductive layer 15 are sequentially formed on the entire surface of the first substrate 10 on which the active layer 21 and the lower capacitor electrode 31 are formed.

The first insulating layer 12 may be formed as an inorganic insulating layer formed of $SiN_x$ or $SiO_x$ by PECVD, APCVD, or LPCVD. The first insulating layer 12 is interposed between the active layer 21 of the TFT and the gate electrode 20, thereby acting as a gate insulating layer of the TFT and interposed between the upper capacitor electrode 33 and the lower capacitor electrode 31, thereby acting as a dielectric layer of the capacitor Cst.

The first conductive layer 13 may include at least one selected from transparent materials such as ITO, IZO, ZnO, and $In_2O_3$. The first conductive layer 13 may be patterned into the pixel electrode 43, the lower gate electrode 23, the upper capacitor electrode 33, and the lower pad electrode 53 in subsequent processes.

The second conductive layer 15 may include at least one material selected from silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and copper (Cu). In particular, the second conductive layer 15 may be formed as a three-layered structure of Mo—Al—Mo. In subsequent processes, the second conductive layer 15 may be patterned into the upper gate electrode 25 and the upper pad electrode 55.

However, the first and second conductive layers 13 and 15 are not limited to the above examples, the first conductive layer 13 may include a higher corrosion-resistant material than that of the second conductive layer 15, and the second conductive layer 15 may include a conductive material having a lower resistance than that of the first conductive layer 13, which satisfy the scope of the embodiments of the present invention.

Figure 6:
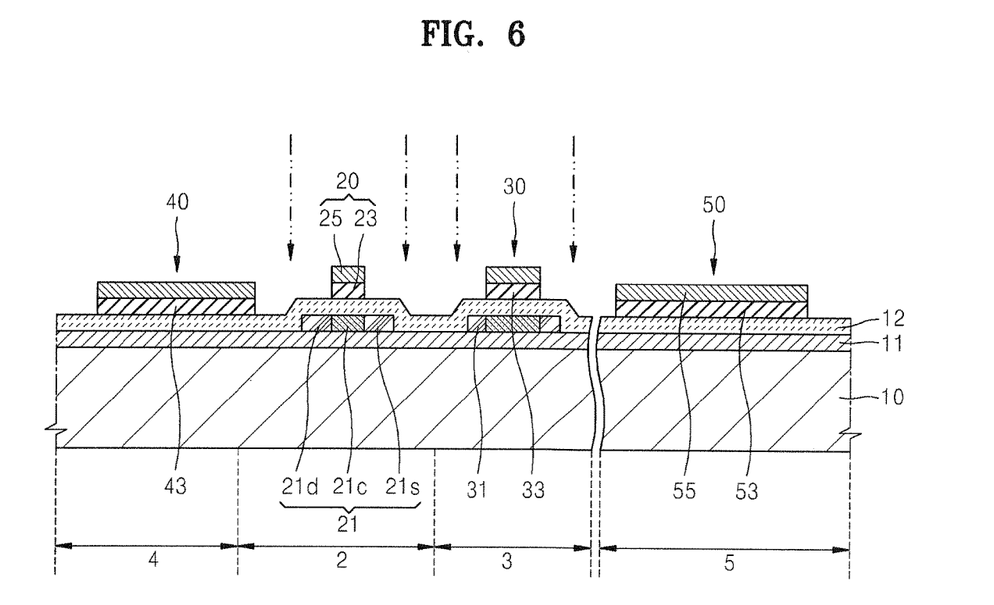

Next, referring to FIG. 6, the gate electrode 20, a first electrode unit 40, a third electrode unit 30, and a second electrode unit 50 may be formed on the first substrate 10.

In detail, the first conductive layer 13 and the second conductive layer 15 that are sequentially stacked on the entire surface of the first substrate 10 are patterned by a mask process using a second mask (not shown).

In this regard, in the transistor region 2, the gate electrode 20 is formed above the active layer 21, and the gate electrode 20 includes the lower gate electrode 23 formed from part of the first conductive layer 13 and the upper gate electrode 25 formed from part of the second conductive layer 15.

The gate electrode 20 is formed to correspond to a central area of the active layer 21, and the active layer 21 is doped with n-type or p-type impurities by using the gate electrode 20 as a self-aligned mask so that the active layer 21 includes the source and drain regions $21s$ and $21d$ formed on both sides thereof and a channel region $21c$ disposed therebetween. In this regard, the n-type or p-type impurities may be boron (B) ions or phosphorus (P) ions.

In the storage region 3, the third electrode unit 30 for forming the upper capacitor electrode 33 in a subsequent process is formed above the lower capacitor electrode 31. In the light-emitting region 4, the first electrode unit 40 for forming the pixel electrode 43 in a subsequent process is formed. In the pad region 5, the second electrode unit 50 for forming the pad electrode PAD in a subsequent process is formed.

Figure 7:
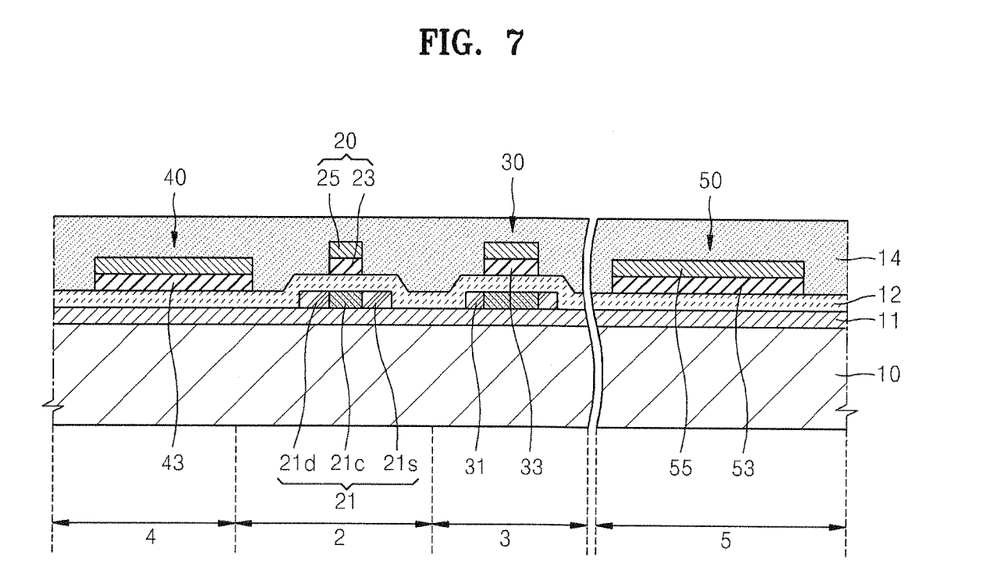

Next, referring to FIG. 7, the second insulating layer 14 is formed to cover the first substrate 10 on which the gate electrode 20 is formed.

The second insulating layer 14 may be formed of at least one organic insulating material selected from the group consisting of polyimide, polyamide, acryl resin, benzocyclobutene, and phenol resin by using a spin coating method. The second insulating layer 14 may be formed sufficiently thick, for example, thicker than the first insulating layer 12, so as to act as an interlayer insulating layer between the gate electrode 20 of the TFT and the source/drain electrodes 29 and 27. The second insulating layer 14 may be formed of the aforementioned organic insulating material and an inorganic insulating material, like the first insulating layer 12. Also, the second insulating layer 14 may be formed of a layer of an organic insulating material and a layer of an inorganic insulating material that are alternately stacked.

Figure 8:
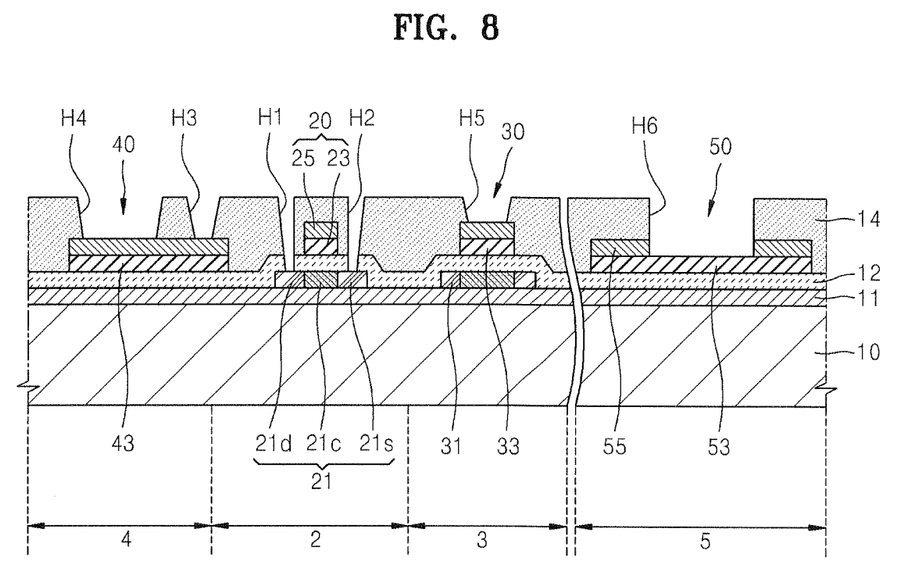

Next, referring to FIG. 8, the second insulating layer 14 may be patterned to form openings H3, H4, and H5 that partially expose the first and third electrode units 30 and 40, contact holes H1 and H2 that expose portions of source and drain regions $21s$ and $21d$ of the active layer 21, and an opening H6 that partially exposes the upper pad electrode 55.

In detail, the second insulating layer 14 may be patterned by a mask process using a third mask (not shown) to form the openings H3, H4, H5, and H6 and the contact holes H1 and H2. In this regard, the contact holes H1 and H2 respectively expose the portions of the source and drain regions $21s$ and $21d$, and the openings H3 and H4 expose at least a portion of the second conductive layer 15 constituting an upper portion of the first electrode unit 40. The opening H5 exposes at least a portion of the second conductive layer 15 constituting an upper portion of the third electrode unit 30. The opening H6 exposes at least a portion of the second conductive layer 15 constituting an upper portion of the second electrode unit 50.

Also, as illustrated in FIG. 8 the openings H3 and H5 may be formed to expose a part of surfaces of the third and first electrode units 30 and 40, but are not limited thereto.

Figure 9:
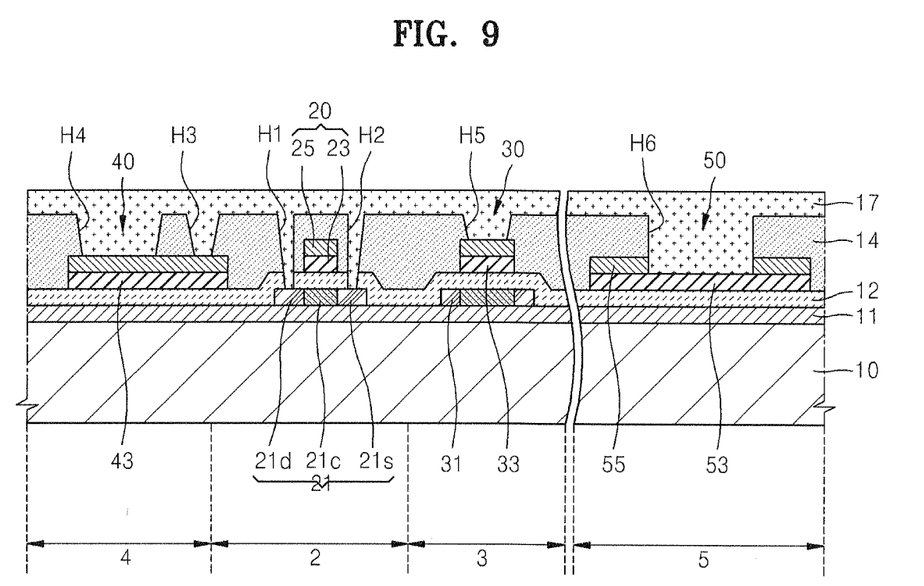

Next, referring to FIG. 9, a third conductive layer 17 may be formed on the result structure of the mask process of FIG. 8 to cover the second insulating layer 14.

The third conductive layer 17 may be formed of a material selected from the conductive materials of the first or second conductive layer 13 or 15, but is not limited thereto. In addition, the conductive materials are deposited to a thickness sufficient to fill the contact holes H1 and H2 and the openings H3, H4, H5, and H6.

Figure 10:
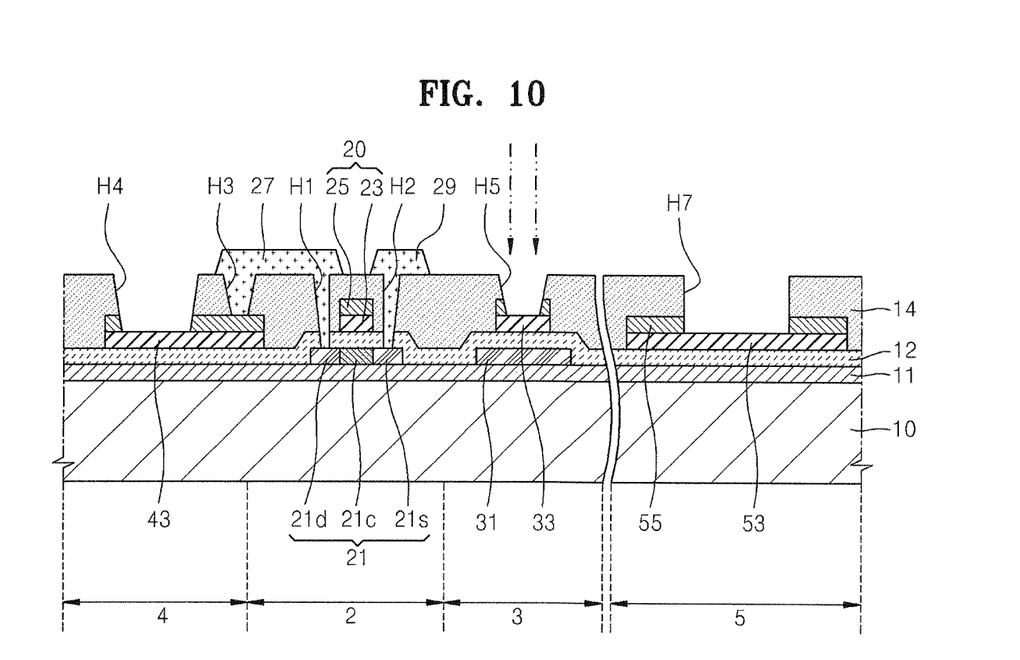

Next, referring to FIG. 10, the third conductive layer 17 may be patterned to form the source and drain electrodes 29 and 27, the pixel electrode 43, the upper capacitor electrode 33, and the upper pad electrode 55.

In detail, the third conductive layer 17 may be patterned by a mask process using a fourth mask (not shown) to form the source and drain electrodes 29 and 27.

In this regard, one of the source and drain electrodes 29 and 27 (in this embodiment, the drain electrode 27) may be connected to the pixel electrode 43 through the opening H3 formed in the second insulating layer 14 on the second conductive layer 15 constituting the upper portion of the first electrode unit 40.

In this embodiment, the source and drain electrodes 29 and 27 are formed simultaneously with the pixel electrode 43 and the upper capacitor electrode 33, but are not limited thereto. For example, after the source and drain electrodes 29 and 27 are formed, the pixel electrode 43 and the upper capacitor electrode 33 may be formed by etching. In detail, a portion of the second conductive layer 15 constituting the upper portion of the first electrode unit 40 (refer to FIG. 8), which is exposed by the opening H4, is removed to form the pixel electrode 43, and a portion of the second conductive layer 15 constituting the upper portion of the third electrode unit 30 (refer to FIG. 8), which is exposed by the opening H3, is removed to form the upper capacitor electrode 33.

The second electrode unit 50 (refer to FIG. 8) is formed such that a portion of the upper pad electrode 55 is removed to expose a portion of the lower pad electrode 53 and an opening H8 that exposes the portion of the lower pad electrode 53 to the outside is formed. The upper pad electrode 55 and the second insulating layer 14 have the same etched surface.

The lower pad electrode 53 may be exposed to the outside constitutes the second connection part 50b that is electrically connected to a driver IC (not shown).

Thus, the lower gate electrode 23, the upper capacitor electrode 33, and the pixel electrode 43 may be formed of the same material at the same layer level.

In this regard, the lower capacitor electrode 31 may be doped with n-type or p-type impurities by implantation through the opening H5. The impurities implanted in the doping process may be identical to or different from those used in the doping process of the active layer 21.

Figure 11:
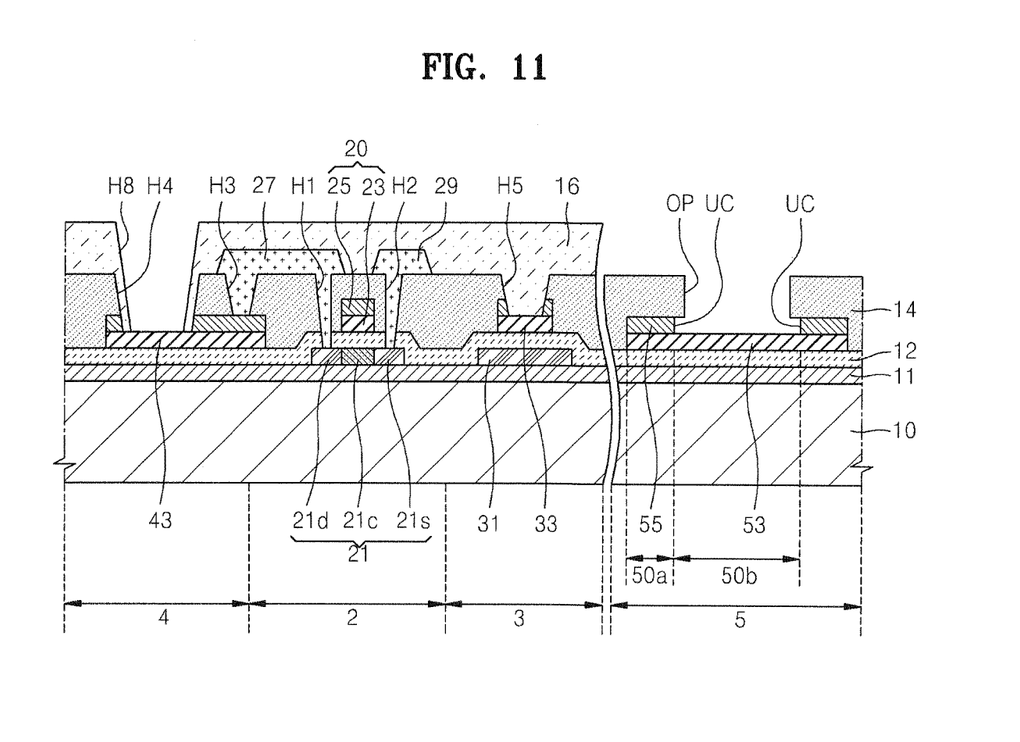

Next, referring to FIG. 11, a third insulating layer 16, i.e., a pixel-defining layer (PDL), is formed on the result structure of the mask process of FIG. 10.

In detail, the third insulating layer 16 may be formed to cover the pixel electrode 43, the source and drain electrodes 29 and 27, the upper capacitor electrode 33, and the pad electrode PAD. In this regard, the third insulating layer 16 may be formed of at least one organic insulating material selected from the group consisting of polyimide, polyamide, acryl resin, benzocyclobutene, and phenol resin by using a spin coating method. Also, the third insulating layer 16 may be formed of an inorganic insulating material selected from $SiO_2$, $SiNx$, $Al_2O_3$, $CuOx$, $Tb_4O_7$, $Y_2O_3$, $Nb_2O_5$, $Pr_2O_3$, and the like. In addition, the third insulating layer 16 may have a multi-layered structure in which a layer of an organic insulating material and a layer of an inorganic insulating material are alternately formed.

The third insulating layer 16 may be optionally formed.

The third insulating layer 16 is patterned by a mask process using a fifth mask (not shown) to form an opening H7 that exposes a center area of the pixel electrode 43, thereby defining pixels. When the third insulating layer 16 is formed on the pad region 5, the third insulating layer 16 on the pad region 5 is removed by the mask process using a fifth mask.

As the third insulating layer 16 is removed, an opening OP is formed in the second insulating layer 14 and the upper pad electrode 55 has an undercut shape in which the insulating layer entirely covers the upper pad electrode and overhangs the upper pad electrode. That is, when the third insulating layer 16 on the pad region 5 is etched, the upper pad electrode 55 is etched from its side surface and the second insulating layer 14 is less etched than the upper pad electrode 55 or not etched so that the upper pad electrode 55 has the undercut structure. Consequently, a removed area of the upper pad electrode 55 is greater than a removed area of the second insulating layer 14 so that the upper pad electrode 55 has the undercut shape in which the insulating layer 14 entirely covers the upper pad electrode 55 and overhangs the upper pad electrode 55. Subsequently, as illustrated in FIG. 2, the intermediate layer 44 including an emission layer and the counter electrode 45 are formed in the opening H7 that partially exposes the pixel electrode 43.

The intermediate layer 44 may include an organic emissive layer (EML) and a single layer selected from a hole transport layer (HTL), a hole injection layer (HIL), an electron transport layer (ETL), an electron injection layer (EIL), and the like or a plurality of these layers.

The organic EML may include a low molecular weight or high molecular weight organic material.

When the organic EML is formed of a low molecular weight organic material, the intermediate layer 44 may include a HTL and a HIL that are stacked on the organic EML towards the pixel electrode 43, and include an ETL and an EIL that are stacked on the organic EML towards the counter electrode 45. The intermediate layer 44 may further include various other layers, if necessary. In this regard, examples of the low molecular weight organic material include copper phthalocyanine (CuPc), N,N'-di(naphthalene-1-yl)-N,N'-diphenyl-benzidine (NPB), tris-8-hydroxyquinoline aluminum ($Alq_3$), and the like.

On the other hand, when the organic EML is formed of a high molecular weight organic material, the intermediate layer 44 may include only a HTL on the organic EML towards the pixel electrode 43. The HTL may be formed on the pixel electrode 43 by inkjet printing or spin coating poly-(2,4)-ethylene-dihydroxythiophene (PEDOT) or polyaniline (PANI). Examples of the high molecular weight organic material include poly-phenylenevinylene (PPV) and polyfluorene, and color patterns may be formed using a general method such as inkjet printing, spin coating, or laser thermal transfer.

The counter electrode 45 may be formed on the entire surface of the first substrate 10 as a common electrode. In the organic light-emitting display device 1, the pixel electrode 43 is used as an anode and the counter electrode 45 is used as a cathode; however, the opposite case is also possible.

If the organic light-emitting display device 1 is a bottom-emission type organic light-emitting display device in which the image is displayed towards the first substrate 10, the pixel electrode 43 may be formed as a transparent electrode and the counter electrode 45 may be formed as a reflective electrode. In this regard, the reflective electrode may be formed of a metal having low work function, for example, Ag, Mg, Al, Pt, Pd, Au, Ni, Nd, Ir, Cr, Li, Ca, LiF/Ca, LiF/Al, or compounds thereof to a small thickness.

Figure 12A:
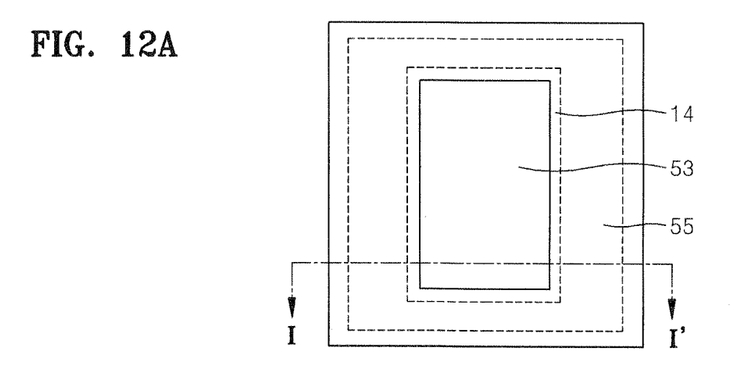
FIGS. 12A through 12C are views particularly illustrating a pad electrode included in the organic light-emitting display device of FIG. 2, according to embodiments of the present invention.
Figure 12B:
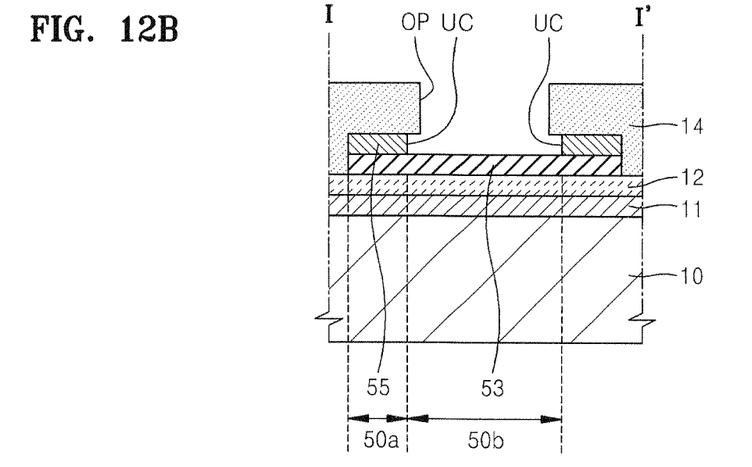
Figure 12C:
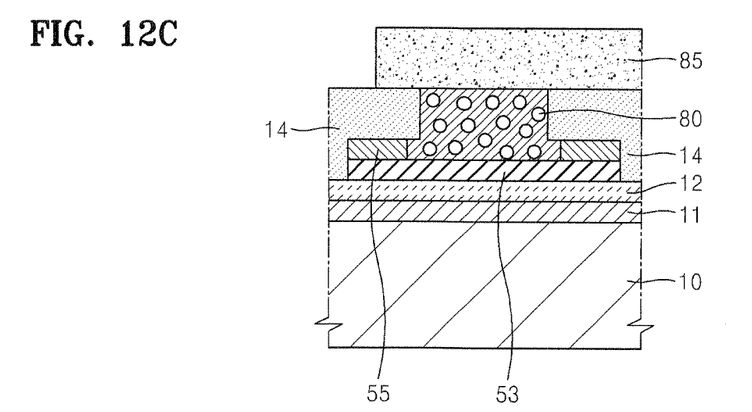

FIGS. 12A through 12C are views particularly illustrating the pad electrode PAD included in the organic light-emitting display device 1 of FIG. 2, according to embodiments of the present invention.

FIG. 12A is a schematic plan view of the pad electrode PAD of the organic light-emitting display device 1 of FIG. 2, according to an embodiment of the present invention, FIG. 12B is a cross-sectional view taken along line I-I' of FIG. 12A, according to an embodiment of the present invention, and FIG. 12C is a cross-sectional view illustrating a state in which a driver IC 85 is connected to the structure of FIG. 12B.

Referring to FIGS. 12A through 12C, the lower pad electrode 53 may be partially exposed through the opening OP, and the upper pad electrode 55 is more etched than the second insulating layer 14 and thus has an undercut shape in which the upper pad electrode 55 is inner than the second insulating layer 14. The upper pad electrode 55 has a surface entirely encompassed by the second insulating layer 14 with a portion of the insulating layer 14 extending beyond the surface of the upper pad electrode 55.

Therefore, conductive balls 80 may be injected into the undercut shape for a better electrical connection between the pad electrode PAD and the driver IC 85.

In each mask process for forming the organic light-emitting display device 1, the stacked layers may be removed by dry etching or wet etching.

In a bottom-emission type organic light-emitting display device according to an embodiment of the present invention, a metal layer may be formed on a bottom surface of a substrate separately from a pixel electrode without increasing or decreasing the number of masks, whereby a luminous efficiency of the pixel electrode is improved and etching characteristics of a gate electrode are obtained. Therefore, the organic light-emitting display device may have improved display quality, manufacturing processes thereof may be simplified, and defects thereof may be reduced.

Although the organic light-emitting display device has been described in the embodiments of the present invention, a variety of display devices, including a liquid crystal display device, may be also used.

In addition, for convenience of explanation, a single TFT and a single capacitor are illustrated in the drawings; however, the present invention is not limited thereto. As long as the number of the mask processes does not increase, the organic light-emitting display device may include a plurality of TFTs and a plurality of capacitors.

As described above, according to the one or more embodiments of the present invention, an organic light-emitting display device may have improved corrosion resistance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device, comprising:
    a thin film transistor comprising an active layer, a gate electrode that is insulated from the active layer and comprises a lower gate electrode and an upper gate electrode, an insulating layer covering the gate electrode, source and drain electrodes that are formed on the insulating layer and contact the active layer;
    an organic light-emitting diode that is electrically connected to the thin film transistor and comprises a pixel electrode formed at the same layer level as the lower gate electrode, an intermediate layer comprising an emission layer, and a counter electrode, the pixel electrode, the intermediate layer, and the counter electrode are sequentially stacked;
    a pad electrode comprising a lower pad electrode formed at the same layer level as the lower gate electrode and an upper pad electrode formed at the same layer level as the upper gate electrode, the insulating layer covering a top surface of the upper pad electrode, and the upper pad electrode comprising an opening formed in the insulating layer and the upper pad electrode to expose a portion of the lower pad electrode; and
    a plurality of conductive balls filling the opening in the insulating layer and the opening in the upper pad electrode.

2. The organic light-emitting display device of claim 1, wherein the upper pad electrode has an undercut shape in which the insulating layer entirely covers the upper pad electrode and overhangs the upper pad electrode.

3. The organic light-emitting display device of claim 2, wherein the undercut shape is formed such that the upper pad electrode has a surface entirely encompassed by the insulating layer with a portion of the insulating layer extending beyond the surface of the upper pad electrode.

4. The organic light-emitting display device of claim 1, wherein a top surface of the lower pad electrode exposed to the outside through the opening and a side surface of the upper pad electrode are electrically connected to a driver IC that supplies a current to operate the organic light-emitting display device.

5. The organic light-emitting display device of claim 4, wherein the top surface of the lower pad electrode exposed to the outside through the opening and the side surface of the upper pad electrode are electrically connected to the driver IC through the plurality of conductive balls.

6. The organic light-emitting display device of claim 1, wherein the pad electrode is electrically connected with the thin film transistor or the organic light-emitting diode through a wire.

7. The organic light-emitting display device of claim 1, wherein the lower pad electrode comprises a higher corrosion resistant material than that of the upper pad electrode.

8. The organic light-emitting display device of claim 1, wherein the lower gate electrode, the pixel electrode, and the lower pad electrode comprise a transparent conductive metal oxide, and the upper gate electrode and the upper pad electrode comprise at least one selected from silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and copper (Cu).

9. The organic light-emitting display device of claim 1, further comprising:
    a capacitor that comprises a lower capacitor electrode formed at the same layer level as the active layer and an upper capacitor electrode formed at the same layer level as the gate electrode, and is electrically connected with the thin film transistor.

10. An organic light-emitting display device, comprising:
    a thin film transistor comprising an active layer, a gate electrode that is insulated from the active layer and comprises a lower gate electrode and an upper gate electrode, an insulating layer covering the gate electrode, source and drain electrodes that are formed on the insulating layer and contact the active layer;

an organic light-emitting diode electrically connected to the thin film transistor and comprises a pixel electrode formed at the same layer level as the lower gate electrode, an intermediate layer comprising an emission layer, and a counter electrode, the pixel electrode, the intermediate layer, and the counter electrode are sequentially stacked;

a pad electrode comprising a lower pad electrode formed at the same layer level as the lower gate electrode and an upper pad electrode formed at the same layer level as the upper gate electrode, said insulating layer covers a top surface of the upper pad electrode, the upper pad electrode has an undercut shape in which the insulating layer entirely covers the upper pad electrode and overhangs the upper pad electrode, the upper pad electrode having an opening formed in the insulating layer and the upper pad electrode to expose a portion of the lower pad electrode;

a driver IC disposed on the insulating layer supplying current to the organic light-emitting display device; and a plurality of conductive balls filing the undercut shape, in the opening in the insulating layer and the opening in the upper pad electrode, said plurality of conductive balls form an electrical connection between the pad electrode and the driver IC.

11. The organic light-emitting display device of claim 10, wherein the undercut shape is formed such that the upper pad electrode has a surface entirely encompassed by the insulating layer with a portion of the insulating layer extending beyond the surface of the upper pad electrode.

* * * * *